United States Patent
Kawazoe et al.

(10) Patent No.: US 7,591,068 B2
(45) Date of Patent: Sep. 22, 2009

(54) BOARD POSITIONING METHOD

(75) Inventors: Masaru Kawazoe, Fukuoka (JP); Shigeo Masaki, Osaka (JP); Yoshihiro Mimura, Osaka (JP); Noriyuki Tani, Fukuoka (JP)

(73) Assignee: Panasonic Corporation, Osaka (JP)

( * ) Notice: Subject to any disclaimer, the term of this patent is extended or adjusted under 35 U.S.C. 154(b) by 120 days.

(21) Appl. No.: 11/663,766

(22) PCT Filed: Feb. 13, 2006

(86) PCT No.: PCT/JP2006/002897

§ 371 (c)(1),
(2), (4) Date: Mar. 26, 2007

(87) PCT Pub. No.: WO2006/090654

PCT Pub. Date: Aug. 31, 2006

(65) Prior Publication Data

US 2007/0277369 A1     Dec. 6, 2007

(30) Foreign Application Priority Data

Feb. 25, 2005   (JP) ............................ 2005-051981

(51) Int. Cl.
*H05K 3/30*    (2006.01)
*B23P 23/00*   (2006.01)
(52) U.S. Cl. ................... 29/832; 29/564; 29/564.1; 29/740
(58) Field of Classification Search ............ 29/564, 29/564.1, 739, 740, 741, 832
See application file for complete search history.

(56) References Cited

U.S. PATENT DOCUMENTS

| 7,353,594 | B2 * | 4/2008 | Yoshida et al. ............... 29/833 |
| 7,376,486 | B2 * | 5/2008 | Kuribara et al. ............. 700/213 |
| 2007/0277369 | A1 * | 12/2007 | Kawazoe et al. ............. 29/729 |

FOREIGN PATENT DOCUMENTS

| DE | 94 09 434 | 8/1994 |
| EP | 1 509 075 | 2/2005 |
| JP | 2003-188599 | 7/2003 |

* cited by examiner

*Primary Examiner*—C. J Arbes
(74) *Attorney, Agent, or Firm*—Wenderoth, Lind & Ponack, L.L.P.

(57) ABSTRACT

A mounter including at least two mounting stages 109 and 110 where components are mounted onto boards transported from the upstream side in transportation direction of the board 120 and then transport the boards to the downstream side, and the mounter includes a first stopping unit 135 for stopping the board to place a board edge on the downstream side on a first fixed position which is in the downstream side from a first mountable area A, the first mountable area A being a mountable region where the components can be mounted on the first mounting stage 109 on the upstream side, and a second stopping unit 136 for stopping the board to place a board edge on the upstream side on a second fixed position which is the upstream side from a second mountable area A, the second mountable area A being a mountable region where the components can be mounted on the second mounting stage 110.

3 Claims, 14 Drawing Sheets

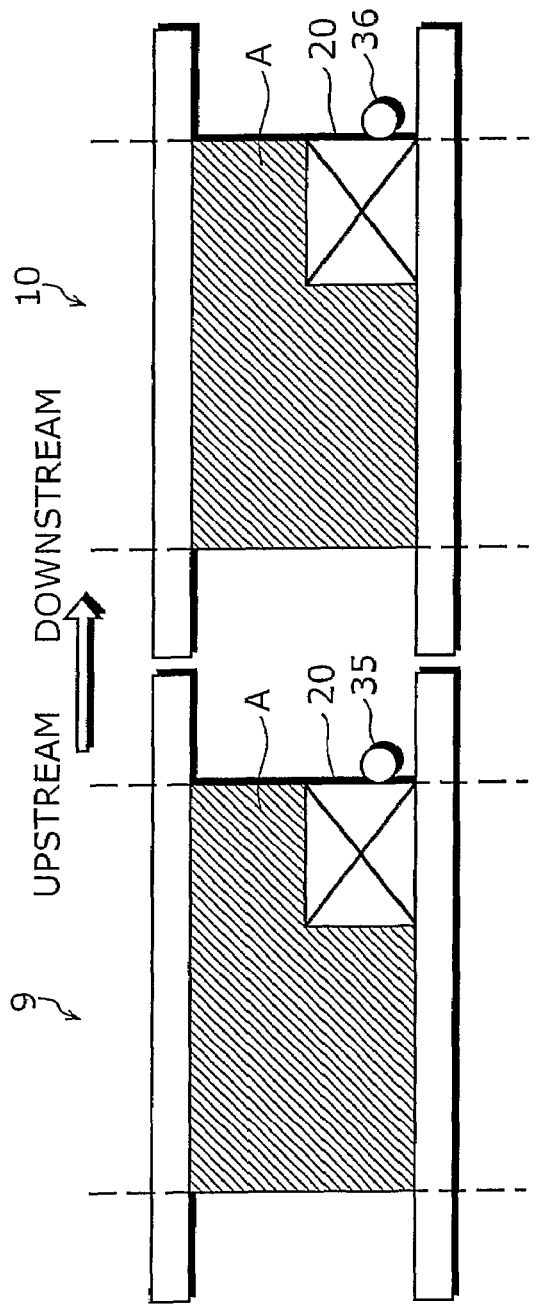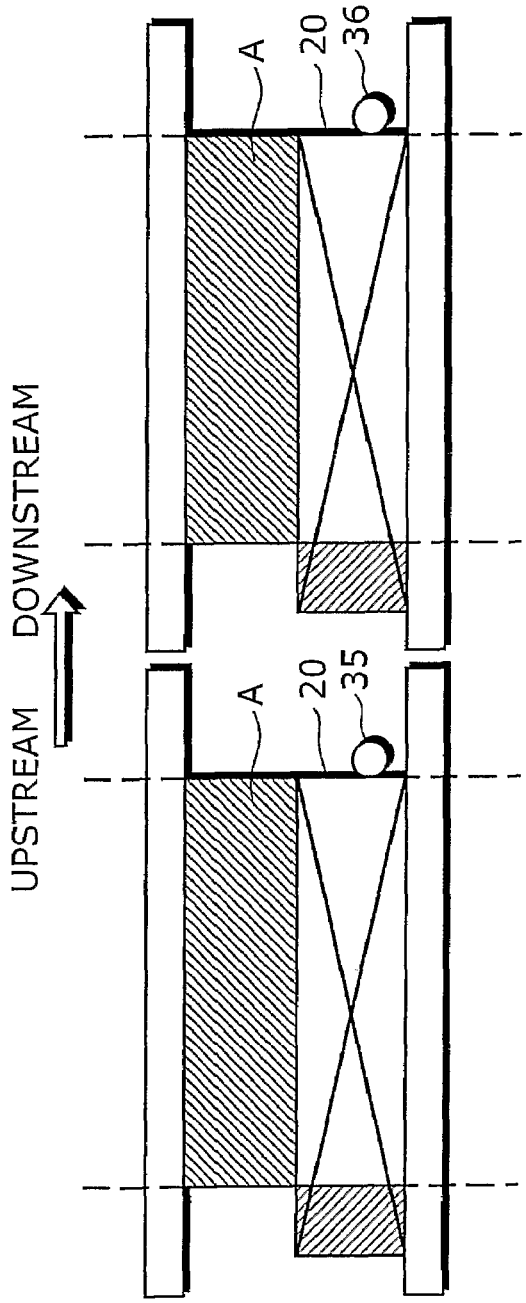

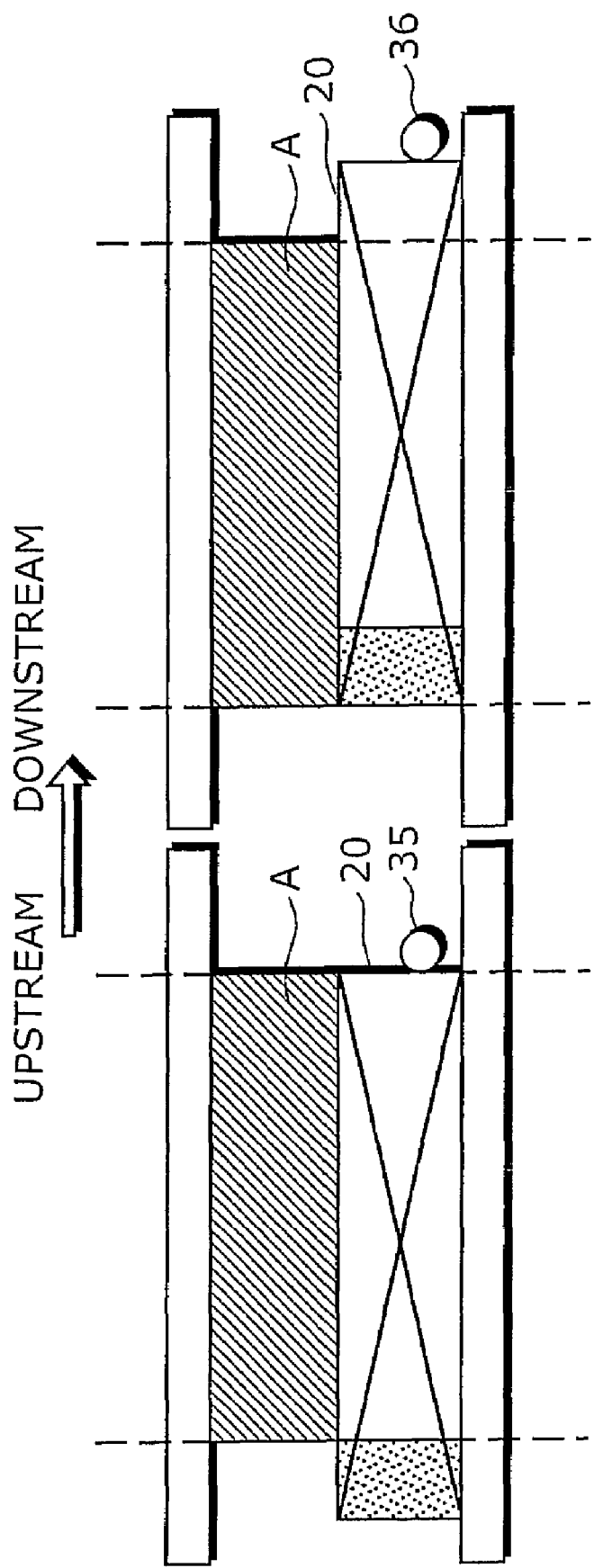

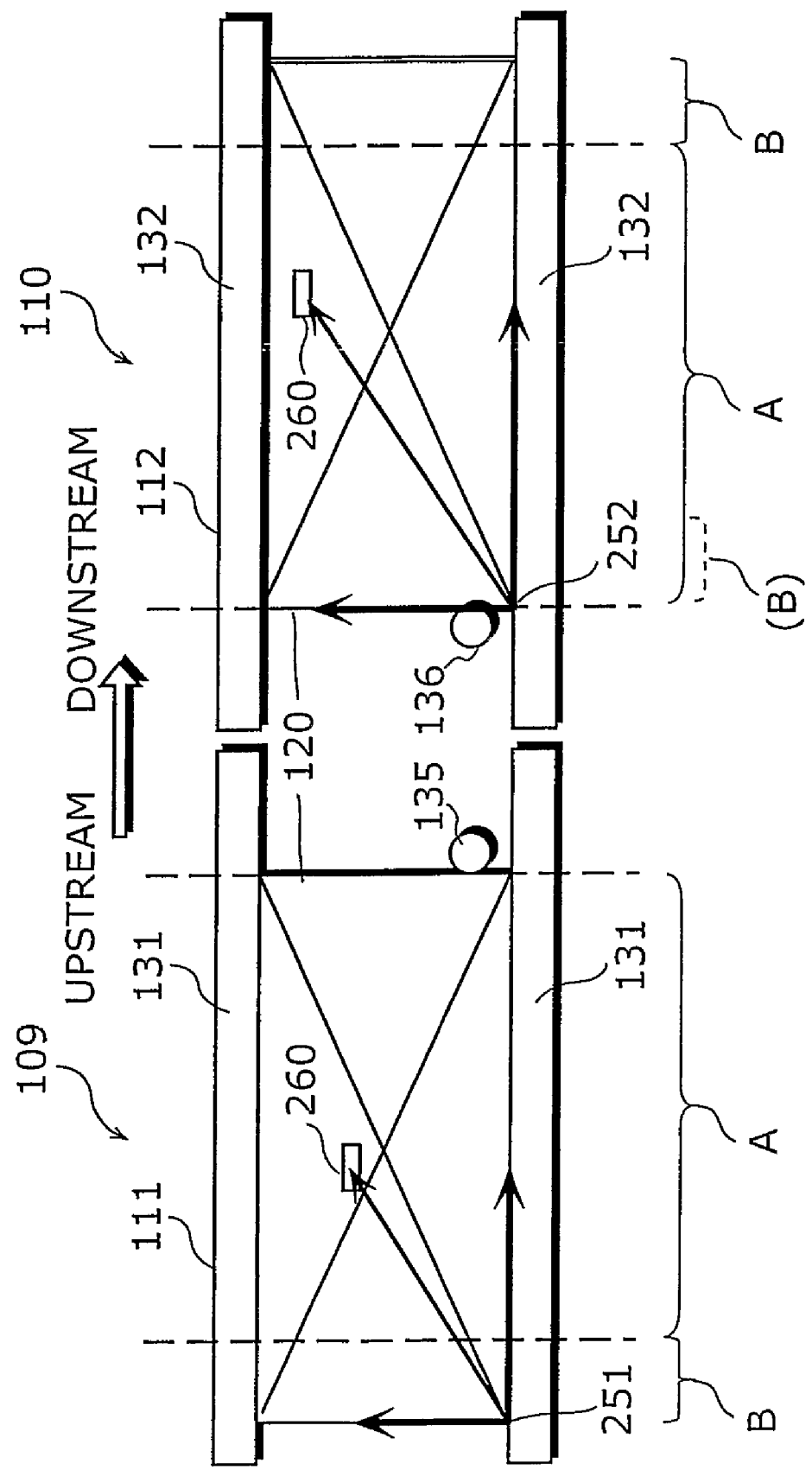

BOARD POSITIONING METHOD

TECHNICAL FIELD

The present invention relates to a mounter for mounting a component onto a board. In particular, the invention relates to the mounter which includes a plurality of component mounting stages on a board transportation line.

BACKGROUND ART

Conventionally, there has been a mounter which includes a plurality of mounting stages for mounting a component onto a board carried in from upstream and for carrying out the component mounted board downstream, in order to improve space-saving and productivity.

For example, in the case where the mounter equipped with two mounting stages, the mounting points of components on a board are evenly divided in two segments and the two segments are assigned to the two mounting stages, so that the time required for the mounting can be evened out. Furthermore, this configuration realizes a space-saving on an assembly-line operation, and the component mounting onto the two boards can be performed simultaneously. Therefore it is possible to improve the throughput and the productivity per area in mounting board production.

FIG. 1 is a plan view showing a frame format of a board transportation block in the aforesaid conventional mounter.

As shown in FIG. 1A, a mounting area A in which the components can be mounted onto a board 20 (shaded area) is fixed based on a movable range of a mounting head on the respective mounting stages 9 and 10. In addition, board stoppers 35 and 36 are placed on the end of each mounting area A on downstream side, so that the board carried-in the mounting stage can be placed at just within the area of the mounting area A.

The carried-in boards 20 are brought into contact with the board stoppers 35 and 36, so that the positions of the boards are determined. Thus, the components are mounted onto the boards on the mounting stages 9 and 10 using the positions of the board stoppers 35 and 36 as reference positions.

However, as shown in FIG. 1B, a long board 20 which exceeds the mounting area A cannot be supported by the conventional mounter.

The reason for this is that the reference positions for mounting components onto the boards are determined at positions where the long boards are in contact with the board stoppers 35 and 36, and therefore the same parts on the both boards run out of the mounting areas A on the boards 20 on the respective stages. In fact, there are areas onto which components are not able to be mounted on the boards on the stages.

In view of this, according to the invention of the reference 1 as shown in FIG. 2, the board stopper 36 is made movable, and the board position is determined so as to place the area, which is out of the mounting area A on the mounting stage upstream, in the area of the mounting area A on the mounting stage downstream. Thus, mounting components onto a long board 20 can be supported.

Japanese Laid Open Patent No. 2003-188599

SUMMARY OF THE INVENTION

In recent years, mounting accuracy in micron order is demanded in the electronic component mounting. However, the board stopper to be a reference position of the board is movable, so that it is likely that the position accuracy may be deteriorated. In order to avoid the deterioration of the positioning accuracy a unit that is complex and solid needs to be equipped additionally to the mounter. Thus, such mounter is prone to grow in size, which results in higher costs. Consequently, the demands to downsize the unit and to enhance the productivity may not be satisfied.

Furthermore, it is necessary to shift the position of the board stopper every time the type of the board is changed, and therefore such adjustment needs a lot of time and the fact results in higher production cost of the mounting board undesirably.

In view of the aforesaid problems, the object of the present invention is to provide a space-saving mounter which enables the mounting of components easily and reliably onto the entire area of a long board which runs out of a mounting area in the mounter including a plurality of mounting stages.

In order to achieve the aforesaid object, the mounter of the present invention is characterized in that it includes at least two mounting stages where components are mounted onto boards transported from the upstream side in a transportation direction of the board and then transport the boards to the downstream side, a first stopping unit to stop the board so as to place a board edge on the downstream side on a first fixed position near an end of a first mounting area on the downstream side, the first mounting area being a mounting range where the component can be mounted on the first mounting stage on the upstream side, and a second stopping unit to stop the board so as to place a board edge on the upstream side on a second fixed position near an end of a second mounting area on the upstream side, the second mounting area being a mounting range where the component can be mounted on the second mounting stage on the downstream side.

In order to achieve the aforesaid object, the board positioning method for the mounter of the present invention is characterized in that the method includes at least two mounting stages where components are mounted onto boards transported from the upstream side in transportation direction of the board and then transport the boards to the downstream side, a first stopping step of stopping the board so as to place a board edge on the downstream side on a first fixed position near an end of a first mounting area on the downstream side, the first mounting area being a mounting range where the component can be mounted on the first mounting stage on the upstream side, and a second stopping step of stopping the board so as to place a board edge on the upstream side on a second fixed position near an end of a second mounting area on the upstream side, the second mounting area being a mounting range where the component can be mounted on the second mounting stage on the downstream side.

According to the aforesaid configuration, it is possible to mount components onto long boards which run out of the mounting areas on the two mounting stages, without changing the units configuration every time depending on the size of the board. Moreover, since the configuration is symmetrical with respect to upstream and downstream directions, the same effect can be achieved in the case where the transportation direction is reversed. Therefore, even in the case where the installation layout of the mounter is different, flexible response can be expected without changing the unit configuration.

It should be noted that the aforesaid object can be achieved not only by the aforesaid method, but also by a board positioning unit which includes the aforesaid characterizing steps as units and performs the board positioning. Furthermore, the object can be achieved by a program causing a computer to execute the aforesaid characterized steps.

Note that it is obvious that such program can be distributed by recording media such as CD-ROM and by communication network such as Internet.

According to the present invention it is possible to perform component mounting onto the entire board which runs out of the mounting area on the mounting stage without changing the unit configuration.

Further the present invention enables flexible response to the installation layout change of the mounter.

Further Information about Technical Background to this Application

The disclosure of Japanese Patent Application No. 2005-51981 filed on Feb. 25, 2005 including specification, drawings and claims is incorporated herein by reference in its entirety.

BRIEF DESCRIPTION OF DRAWINGS

These and other objects, advantages and features of the invention will become apparent from the following description thereof taken in conjunction with the accompanying drawings that illustrate a specific embodiment of the invention. In the Drawings:

FIG. 1A and FIG. 1B are plan views showing problematic points of a transportation unit of the conventional mounter;

FIG. 2 is a plan view showing a transportation unit corresponding to an invention shown in a reference;

FIG. 10 is a plan view showing reference positions for coordinates of mounting points and reference positions for the respective mounting stages;

FIG. 11A is a flowchart for the mounting stage on downstream side, and FIG. 11B is a flowchart showing the mounting stage on upstream side;

DETAILED DESCRIPTION OF THE INVENTION

Next an embodiment of the present invention will be described referring to drawings:

First Embodiment

Figure 3:
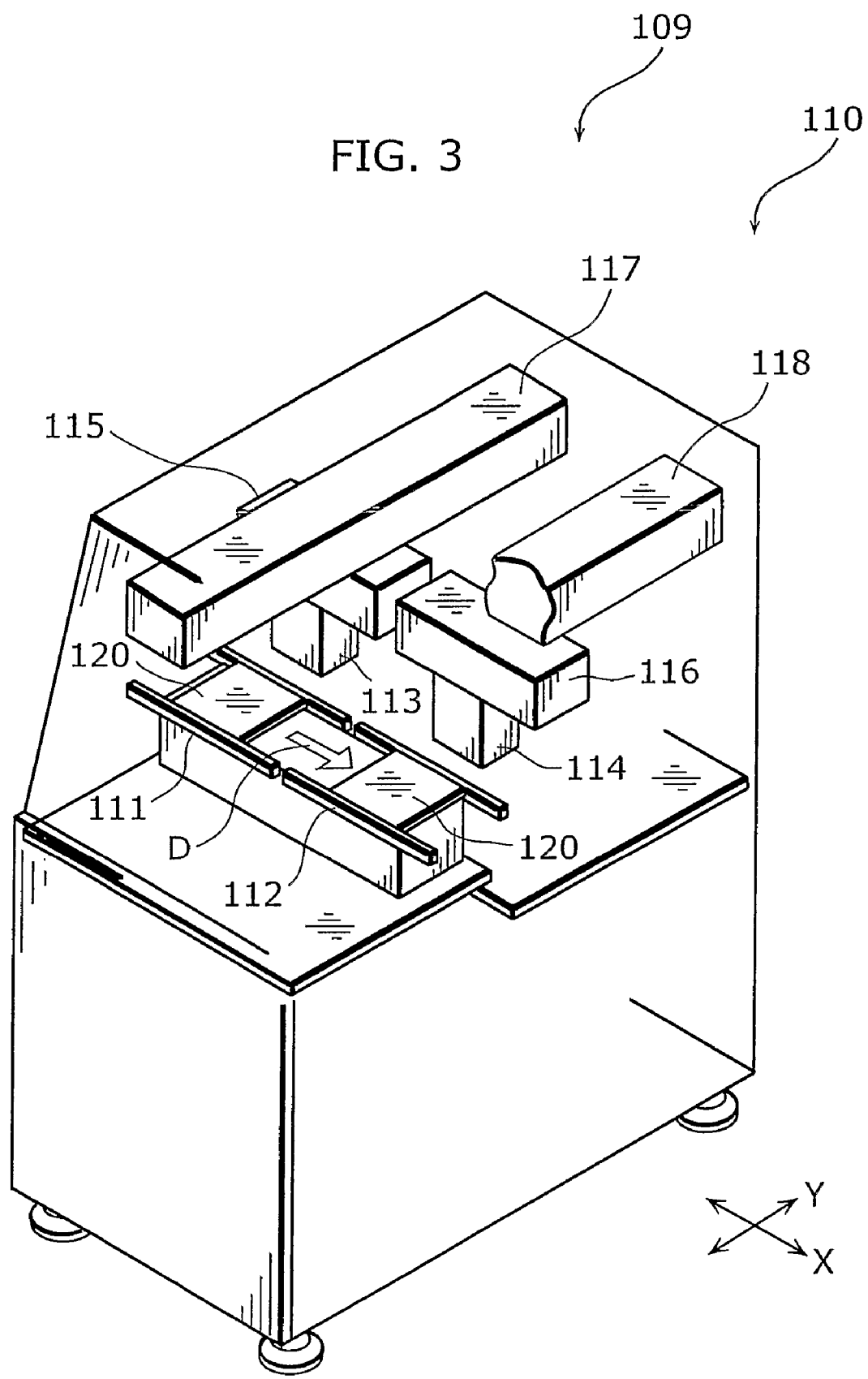
FIG. 3 is an external perspective partially transparent view of a structure of a mounter for the embodiment of the present invention.

FIG. 3 is an external perspective partially transparent view of a structure of a mounter 100 for the embodiment of the present invention.

The mounter 100 mounts an electronic component onto each board 120 which is transported sequentially downstream (in the direction of arrow D). The mounter 100 includes two mounting stages 109 and 110 arrayed in transporting direction of the board 120 (X axis direction). The mounting stages 109 and 110 respectively include transportation units 111 and 112, mounting heads 113 and 114, beams 115 and 116, and beam tracks 117 and 118.

Figure 4:
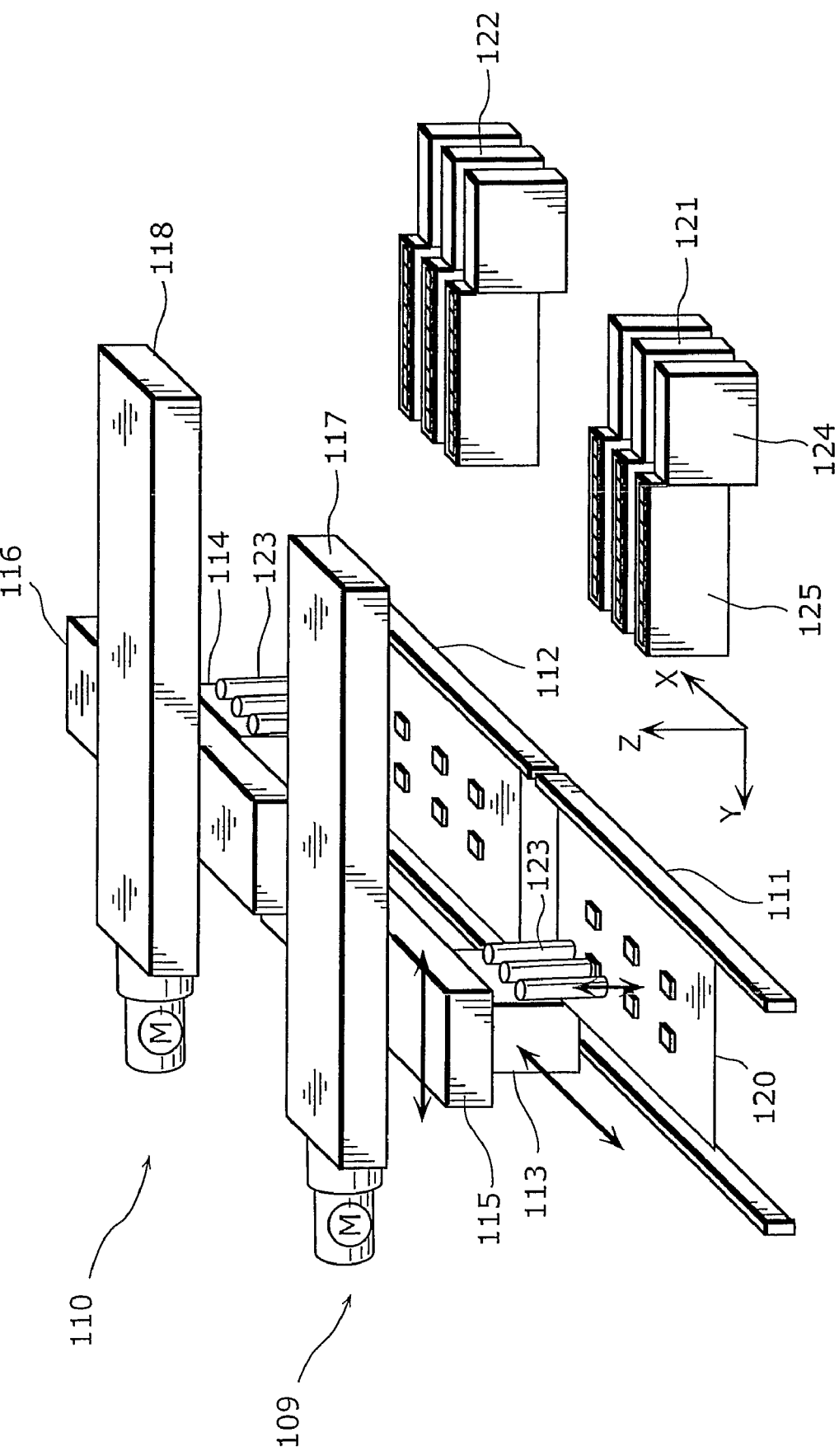
FIG. 4 is a perspective view showing principal components of a mounting stage in the mounter in detail.

FIG. 4 is a perspective view showing the principal components of the mounting stages 109 and 110 in the mounter 100 in detail.

Hereafter, the components of the mounting stage 109 will be described. The components of the mounting stage 110 are the same as the mounting stage 109, and the transportation unit 111 will be described later.

The beam track 117, which is made of a material with high stiffness, is fixed on the mounter 100 from the front side to the back side across the mounter 100. In the beam track 117, a ball screw (not illustrated in the drawing) which is driven by an AC servomotor M is placed, and the ball screw is rotated by the AC servomotor M so as to drive the beam 115 placed on the beam track 117.

The beam 115 placed on the beam track 117 extends in the transportation direction (X axis direction) of the board 120, and the beam 115 is movable in parallel with the beam track 117 (Y axis direction). Further in the beam 115 a linear motor is placed (not illustrated in the drawing) so as to drive the mounting head 113 which is pendent and fixed on the beam 115 in X axis direction along the beam 115.

The mounting head 113 fixed on the beam 115 is a unit which is able to hold an electronic component and to mount onto a board, and also is able to move along the beam 115 (X axis direction). Accordingly the mounting area of electronic components onto the board is determined based on the movable range of the mounting head 113 along the beam 115.

Additionally, the mounting head 113 holds electronic components by vacuum suction, and has a plurality of holding nozzles 123 (multi mounting head). The holding nozzles 123 are able to hold a plurality of electronic components by vacuum suction, and to transport the electronic components so as to mount onto the board 120.

The mounter 100 further includes component supply units 121 and 122 for the respective mounting stages 109 and 110.

The component supply unit 121 holds plurality kinds of electronic components, and supplies the electronic components to the mounting stage 109 on the basis of demand. The component supply unit 121 has a reel 124 wound with a component tape to hold the same kind of multiple components, and a tape feeder 125 to sequentially supply electronic components held by the component tape. Multiple reels 124 and tape feeders 125 are arrayed in X axis direction and are removable from the mounter 100.

Next the component mounting process will be explained referring to FIG. 4.

The mounting head 113 moves above the component supply unit 121; the holding nozzle 123 is lowered so as to suction and hold the supplied electronic components; and then the holding nozzle 123 is uplifted. The mounting head 113 has a plurality of holding nozzles 123, and the respective holding nozzles 123 suction and hold electronic components.

Next, the beam 115 and the mounting head 113 move so as to transport the electronic components to the mounting points on a board. The mounting point is a position where the corresponding electronic component is mounted, and the coordinate of the position is shown in a two-dimensional coordinate having X axis direction and Y axis direction using a fixed reference position as an origin.

Finally, the holding nozzle 123 is lowered so as to mount the electronic component on the board.

The aforesaid mounting process is reiterated and all necessary electronic components are mounted onto the board.

Figure 5:
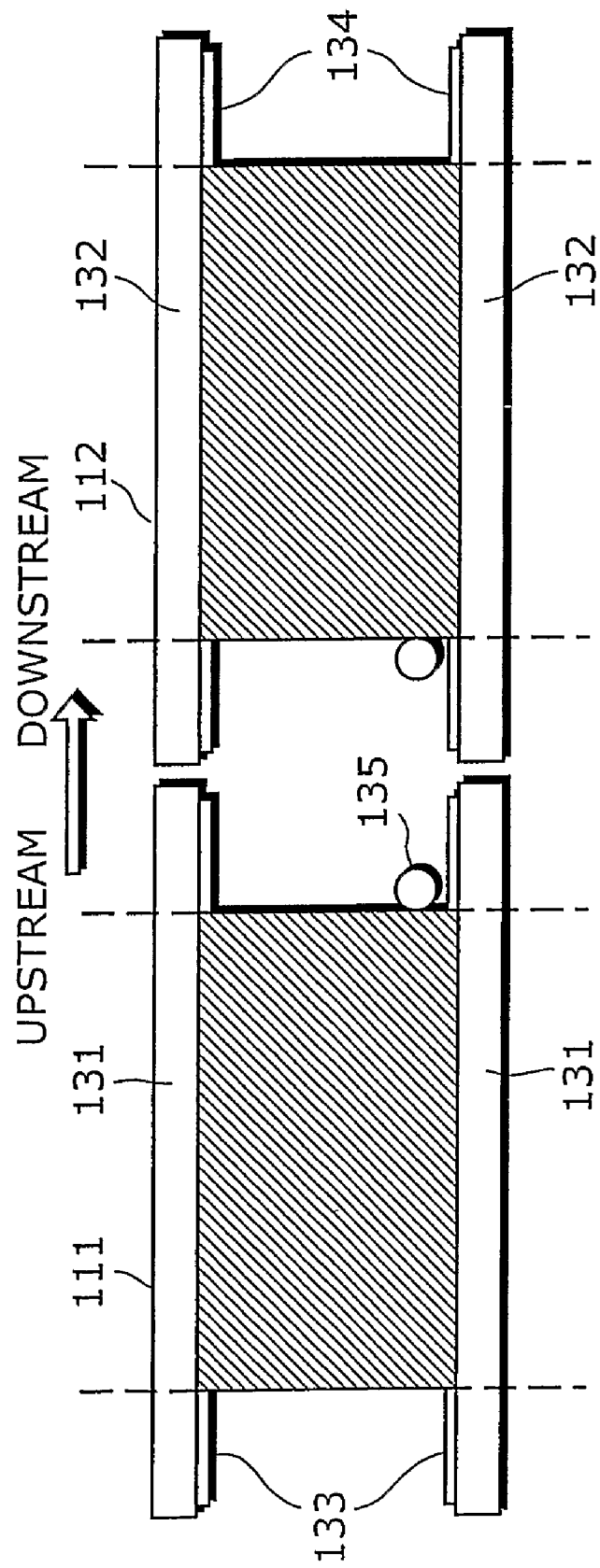
FIG. 5 is a plan view showing the transportation units for the present embodiment in detail.

FIG. 5 is a plan view showing the transportation units 111 and 112 of the present embodiment in detail.

The respective transportation units 111 and 112 have belt conveyers 133 and 134 which are able to transport boards to between the two rails 131 and the two rails 132 aligned in parallel. The belt conveyors 133 and 134 are driven by motors, so that the boards 120 whose both edges are placed on the belt conveyors 133 and 134 can be transported. At the time of the transportation of the board 120, the both edges of the board, which is facing to the transport direction, are guided by the rails, so that the transport direction of the board 120 is controlled. It should be noted that the operation of the transportation units 111 and 112 are controlled by the transportation control units (a first transportation control unit and a second transportation control unit) to be hereafter described.

(A board sensor 135 which functions as a first stopping unit and a board sensor 136 which functions as a second stopping unit are respectively available on the downstream side of the transportation unit 111 located on the upstream side and the upstream side of the transportation unit 112 located on the downstream side.

Under the condition that the board sensors 135 and 136 are in contact with the respective edges of the boards 120 transported by the transportation units 111 and 112, the board sensors 135 and 136 function as stoppers to stop the transportation of the boards 120, and also the board sensors 135 and 136 detect that the boards 120 are in contact with the sensors 135 and 136 and transmit the signals indicating the contacts. In addition, each of the board sensors 135 and 136 is extendable and retractable. Thus, it is possible to select whether or not the transportations of the boards 120 are allowed depending on whether the sensor is extended or retracted.

Note that the shaded areas in FIG. 5 are the mounting areas where the electronic components are mounted onto a board.

Figure 6:
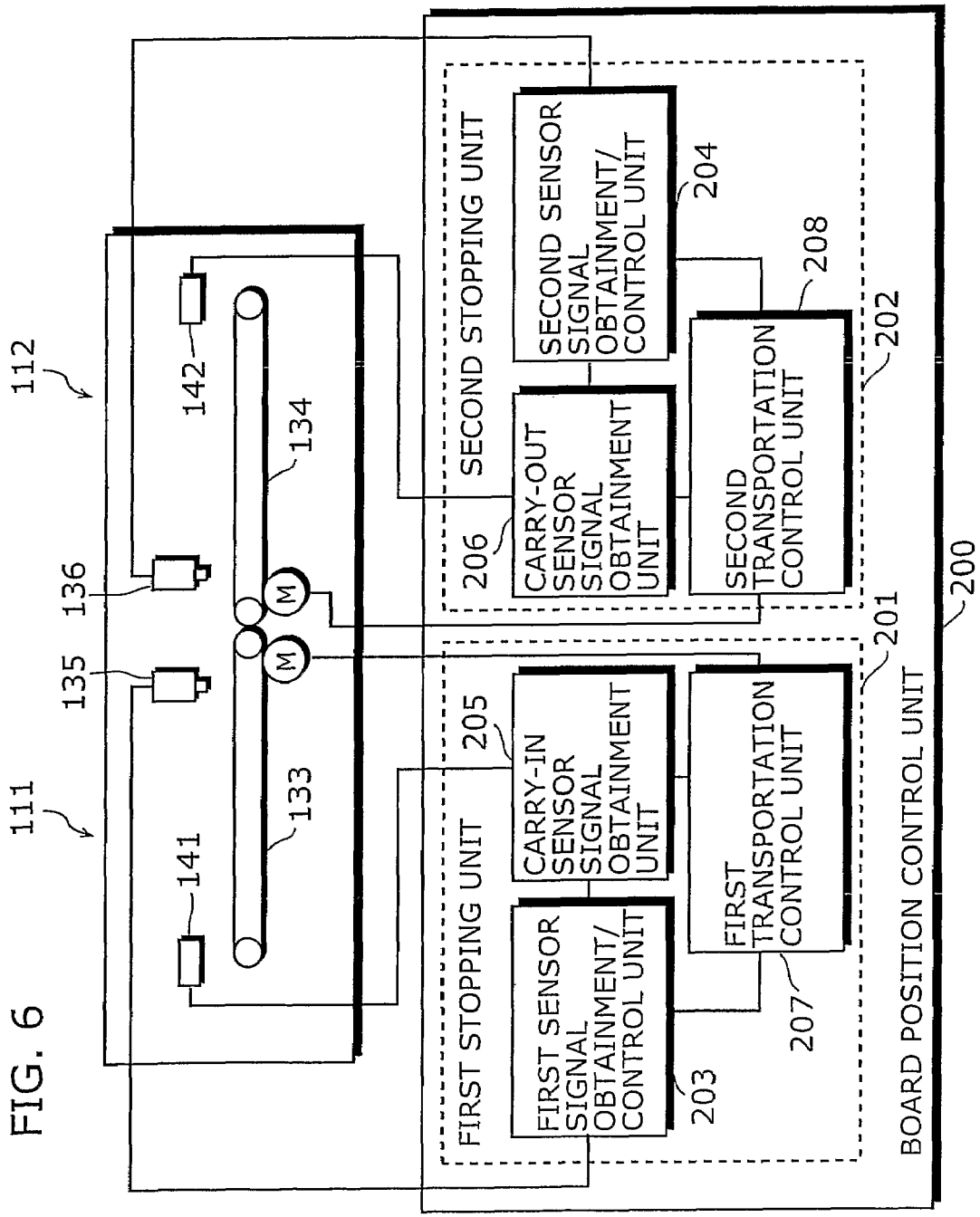
FIG. 6 is a block diagram showing a functional configuration of a board position control unit corresponding to the mounting stage.

FIG. 6 is a block diagram showing a functional configuration of a board position control unit 200 corresponding to the mounting stages 109 and 110.

The board position control unit 200 controls the transportation and the positioning for the boards for the respective mounting stages 109 and 110, and has the first stopping unit 201 and the second stopping unit 202.

The first stopping unit 201 is a processing unit to control mainly the transportation unit 111 of the mounting stage 109, to transport and to position the board 120. The first stopping unit 201 has a first sensor signal obtainment/control unit 203, a carry-in sensor signal obtainment unit 205 and a first transportation control unit 207.

The first sensor signal obtainment/control unit 203 is a processing unit to control extending/retracting the first board sensor 135, and also to receive a signal indicating that the board 120 is in contact with the first board sensor 135.

The carry-in sensor signal obtainment unit 205 is a processing unit to obtain a signal transmitted from a carry-in sensor 141.

The first transportation control unit 207 is a processing unit to analyze the control condition and the signal of the first board sensor 135 and the signal from the carry-in sensor 141 so as to control the transportation of the board 120 on the transportation unit 111 using the motor M, and to stop the transportation of the board 120 based on the signal, which indicates the board 120 is in contact with the first board sensor 135, transmitted from the first board sensor 135.

Here, the carry-in sensor 141 is placed on the upstream side of the mounting stage 109 and the outside of the conveyor, and is able to detect that the board 120 is carried in the transportation unit 111. The carry-in sensor 141 is also able to detect whether or not the board 120 exists on the transportation unit 111 just beneath the carry-in sensor 141, and to transmit the signal.

A second stopping unit 202 is a processing unit to control mainly the transportation unit 112 of the mounting stage 110, to transport and to position the board 120. The second stopping unit 202 has a second sensor signal obtainment/control unit 204, a carry-out sensor signal obtainment unit 206 and a second transportation control unit 208.

The second sensor signal obtainment/control unit 204 is a processing unit functions as the first sensor signal obtainment/control unit 203.

The carry-out sensor signal obtainment unit 206 is a processing unit to obtain the signal transmitted from a carry-out sensor 142.

The second transportation control unit 208 is a processing unit to analyze the control condition and the signal of the second board sensor 136 and the signal from the carry-out sensor 142 so as to control the transportation of the board 120 on the transportation unit 112 using the motor M, and to stop the transportation of the board 120 based on the signal, which indicates the board 120 is in contact with the second board sensor 136, transmitted from the second board sensor 136. In particular, the second transportation control unit 208 is able to reverse the motor M of the transportation unit 112 so as to transport the board 120 in the reverse direction of the ordinary direction.

Here, the carry-out sensor 142 is a sensor placed on the downstream side of the mounting stage 110 and the outside of the conveyor, and is able to detect a carrying-out of the board 120. The carry-out sensor 142 is also able to detect whether or not the board 120 exists on the transportation unit 112 just below the carry-out sensor 142, and to transmit the signal.

It should be noted that the board sensors 135 and 136 are able to function as stoppers to stop the transportations of the boards 120, and to function as contact sensors. However the stopper and the sensor may be separated.

In addition, the contact sensor can be replaced by other sensors such as a proximity sensor, a photo sensor and the like as long as the sensor is able to detect the positioning of the board 120.

In addition, the board 120 may be transported not only by a conveyor but also by other methods. For example, the board may be transported by sliding the undersurface of the board.

In addition, the stopper of the board is not limited to the aforesaid stopper. The stopper can be replaced by other methods which is able to stop board edges facing each other. For example, the board 120 may be stopped at a predetermined position by a chuck which holds either side of the boards 120.

Figure 7:
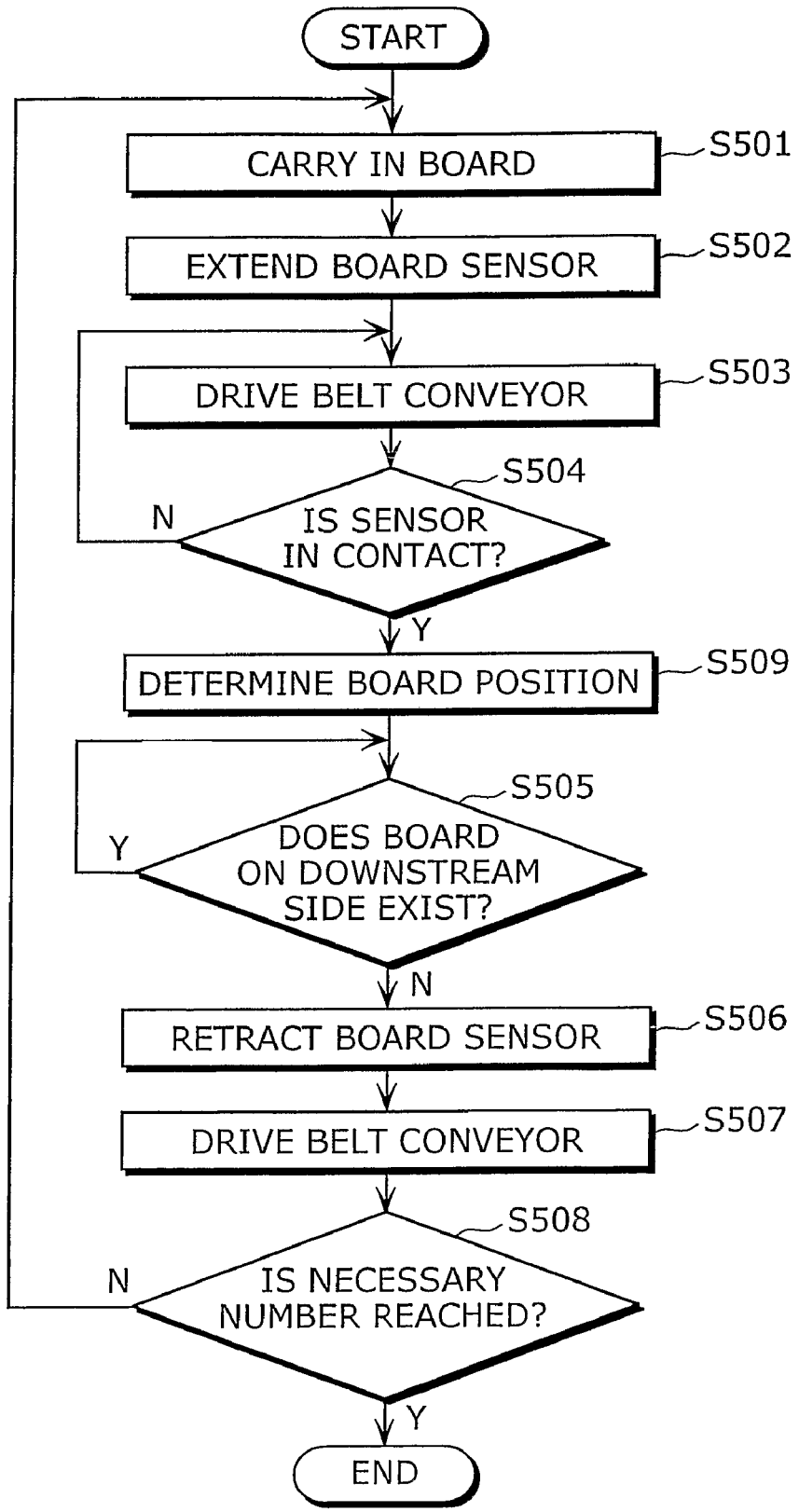
FIG. 7 is a flowchart showing a processing operation of the board position control unit corresponding to the mounting stage on upstream side.
Figure 8:
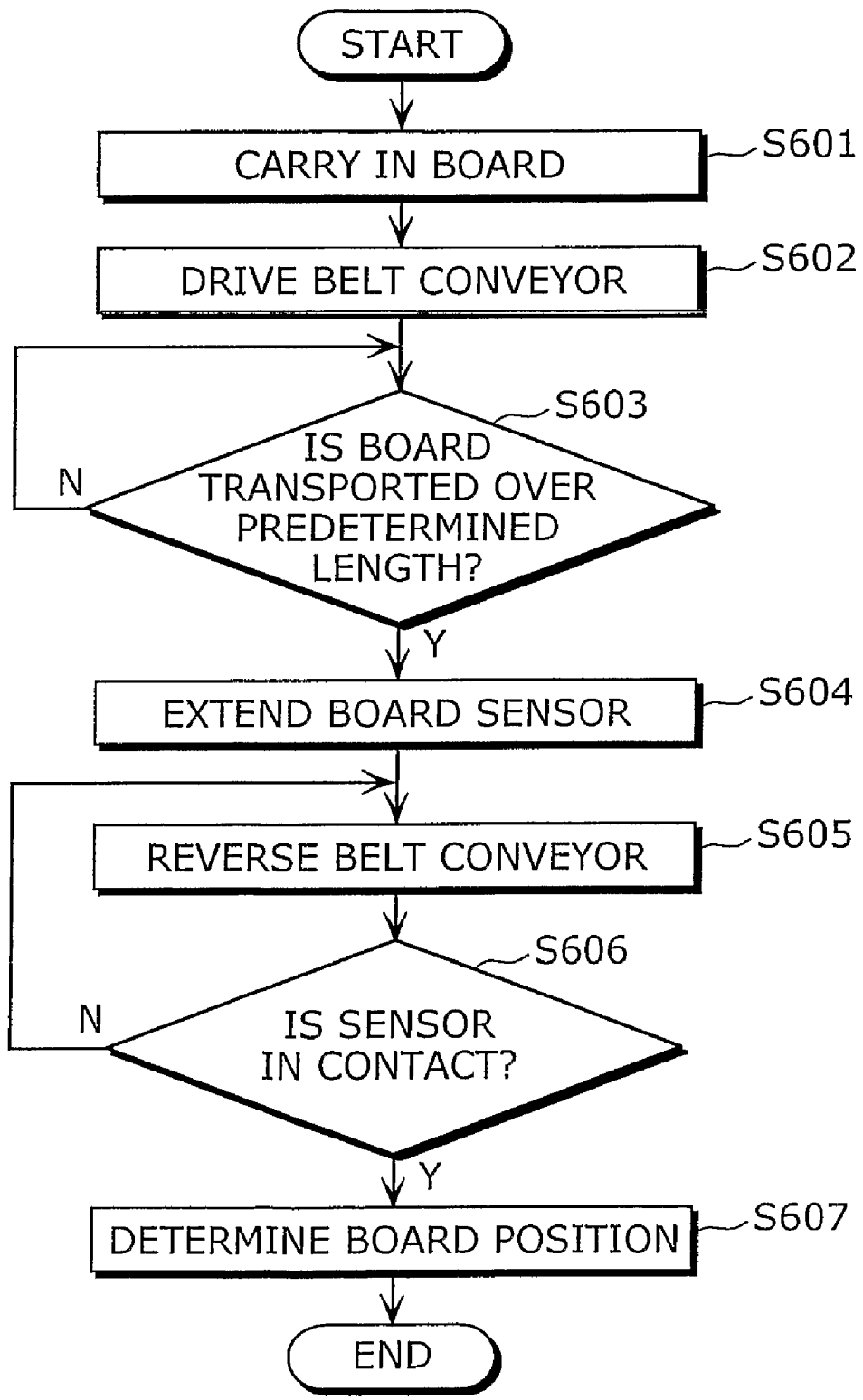
FIG. 8 is a flowchart showing a processing operation of the board position control unit corresponding to the mounting stage on downstream side.
Figure 9:
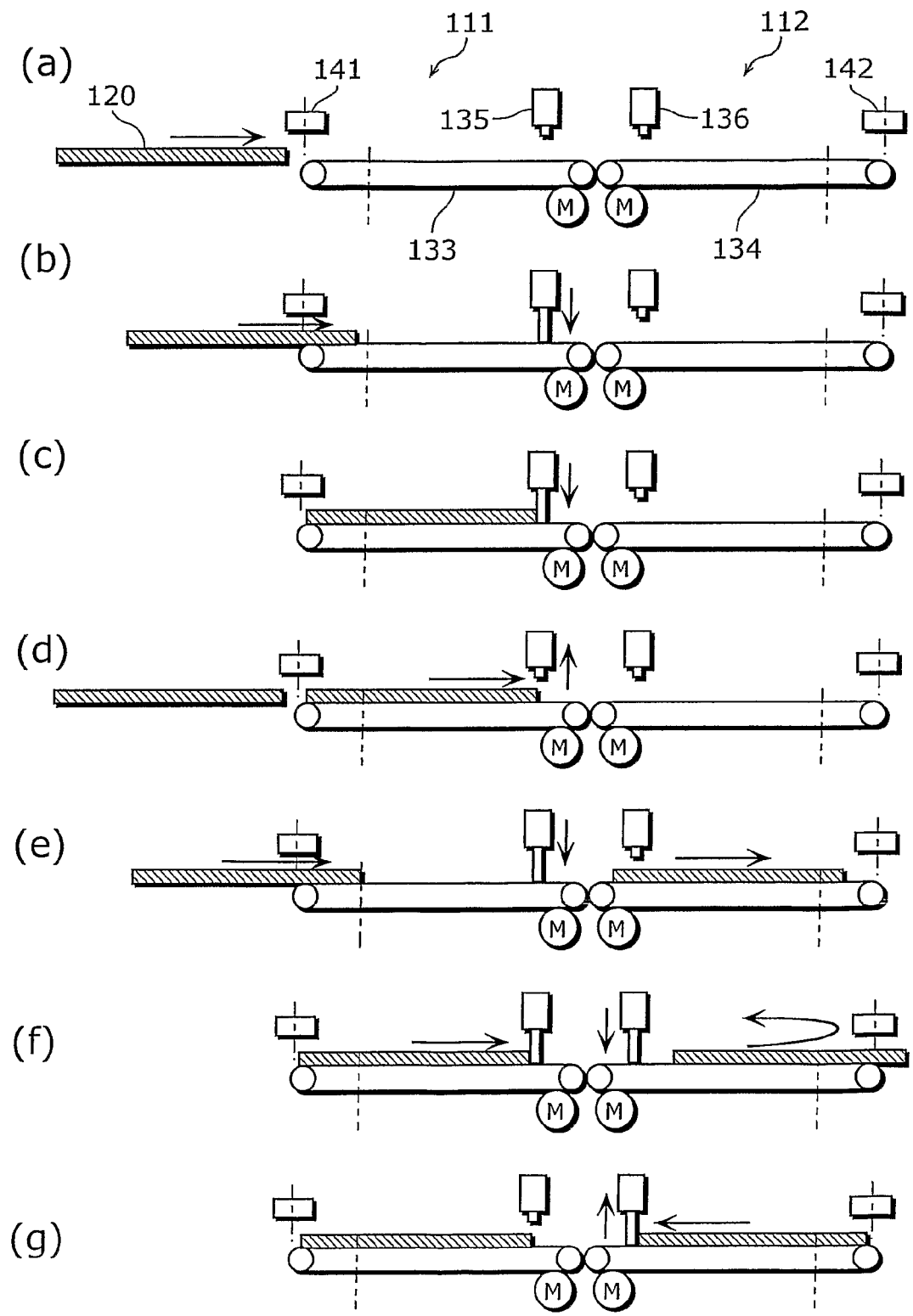
FIG. 9 is a side view showing a flow of the board and a motion of the board sensors sequentially.

Next, the positioning method of the board 120 is described referring to FIG. 7 to FIG. 9.

FIG. 7 is a flowchart showing a processing operation of the transportation unit 111 and the like.

FIG. 8 is a flowchart showing a processing operation of the transportation unit 112 and the like.

FIG. 9 is a side view showing a flow of the board 120 and motions of the board sensors 135 and 136.

Firstly, the operation of the transportation unit 111 is described referring to FIG. 7 and FIG. 9.

Initially, the board 120 is carried in the mounter 100 (S501) (FIG. 9(a)).

The board 120 is carried in; the carry-in sensor 141 detects the carrying in; the carry-in sensor signal obtainment unit 205 obtains a signal indicating the carrying in; and the first sensor signal obtainment/control unit 203 extends the first board sensor 135 upon the obtainment of the signal (S502) (FIG. 9(b)). The first transportation control unit 207 drives the belt conveyer 133 (S503) by the motor M until the board edge of the downstream side is brought into contact with the first board sensor 135 (S504: Y) (FIG. 9(c)). Here, in the case where the first sensor signal obtainment/control unit 203 obtains a signal indicating that the board 120 is in contact with the first board sensor 135, the first transportation control unit 207 immediately stops the belt conveyor 133, so that the position of the board 120 is determined (S509).

Next, in the case where the board 120 is confirmed by the board sensor 136 and the like not to exist on the downstream side (S505: N), the first board sensor 135 is retracted (S506); the belt conveyor 133 is driven again (S507) (FIG. 9(d)); the board 120 is carried out; and another board 120 is carried in. The aforesaid sequence of operation (S501 to S507) is reiterated until the necessary number of boards is reached (S508).

Next, the operation of the transportation unit 112 and the like is described referring to FIG. 8 and FIG. 9.

Initially, the board 120 is carried in from the transportation unit 111 (S601) (FIG. 9(e)).

The board 120 is carried in; the belt conveyer 134 is driven based on the control of the second transportation control unit 208, so that the board 120 is transported (S602) (FIG. 9(e)); the board 120 is transported over the carry-out sensor 142; the board 120 is transported for a predetermined length until a position where the board's edge on the upstream side is not below the second board sensor 136 (S603: Y); and the second sensor signal obtainment/control unit extends the second board sensor 136 (S604). At the almost same time, the second transportation control unit 208 reverses the belt conveyor 134 by reversing the motor M (S605) (FIG. 9(f)).

The second transportation control unit 208 drives the belt conveyor 134 to the reverse direction by the motor M until the board edge of the upstream side is brought into contact with the second board sensor 136 (S606: Y) (S605) (FIG. 9(g)). Here, in the case where the second sensor signal obtainment/control unit 204 obtains a signal indicating that the board 120 is brought into contact with the second board sensor 136, the second transportation control unit 208 immediately stops the belt conveyor 134, so that the position of the board 120 is determined (S607).

While the transportation unit 112 is performing the aforesaid operations (S601 to S607), the transportation unit 111 on the upstream side is performing S501 to S509. In fact, two boards 120 whose positions are determined respectively are arrayed in the transportation units 111 and 112.

As shown in FIG. 10, the aforesaid configuration and the method enable placing the non-mounting area B, where the component cannot be mounted, on the upstream side of the board 120 on the mounting stage 109 within the mounting area A on the mounting stage 110 without shifting the board sensor used as a reference position of the board, so that the electronic components can be mounted on the entire area of the board 120.

Furthermore, the transportation unit and the board sensor are placed symmetrically to the upstream side and the downstream side, so that the configuration of the mounter is not necessary to be changed, even though the transportation direction is changed in the case where the setup layout of the mounter is changed (in the case where the board 120 is transported from the right to the left direction in FIG. 9).

It should be noted that the board 120 is transported to the reverse direction after the board is detected by the carry-out sensor 142 in the positioning of the board 120 on the downstream side in the present embodiment. However the present invention is not limited to this. For example, the board may be transported to the reverse direction after the passing of the board is detected by the second board sensor 136 (after the detection is off).

In addition, the board may be transported to the reverse direction after the passing of the board 120 is detected based on the rotation amount of the motor of the conveyor.

In this case it is possible to skip a reverse transportation after a small-sized board 120 is transported to the position of the carry-out sensor 142.

Here, under the condition that two boards 120 are placed on the determined positions respectively, the electronic components are mounted onto the boards 120. In this case it is necessary to match a) the program origins 251 and 252 as reference positions of coordinates of the mounting points 260 (NC coordinates) and b) the reference positions (machine origin) as reference positions of the mounting stages 109 and 110 as shown in FIG. 10. In fact, in the case where the NC program is created based on a coordinate system with the program origin as a reference position, it is necessary to convert into a coordinate system with the machine origin as a reference position as a mounting position at the time of component mounting.

In the present embodiment, it is defined that the origin for the coordinates of the mounting points 260 are lower corners on the upstream side (lower left corner).

Figure 11B:
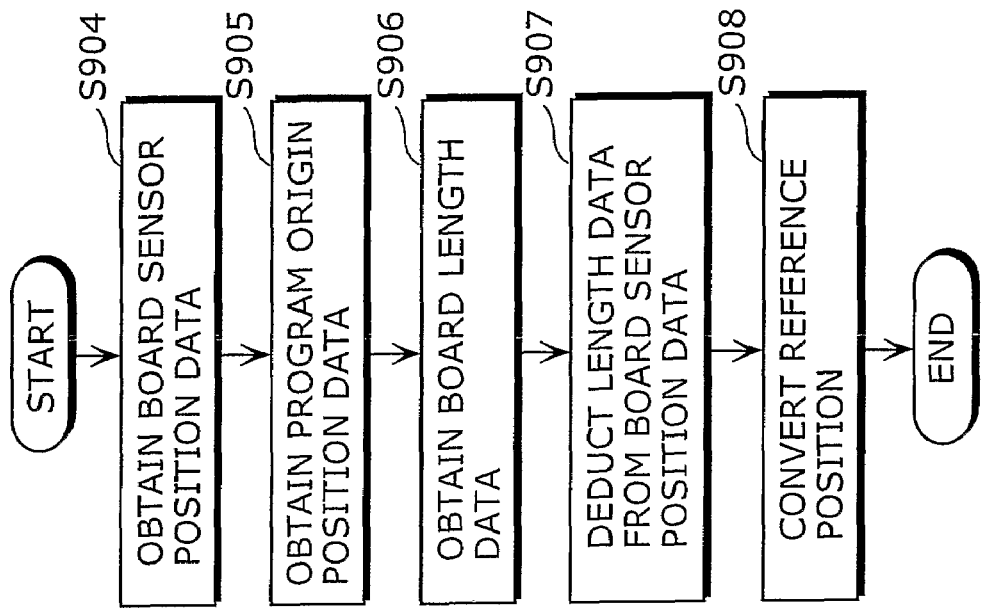
FIGS. 11A and 11B are flowcharts showing a processing operation to correspond a reference coordinate of a mounting point and a reference position on the mounting stage.
Figure 11A:
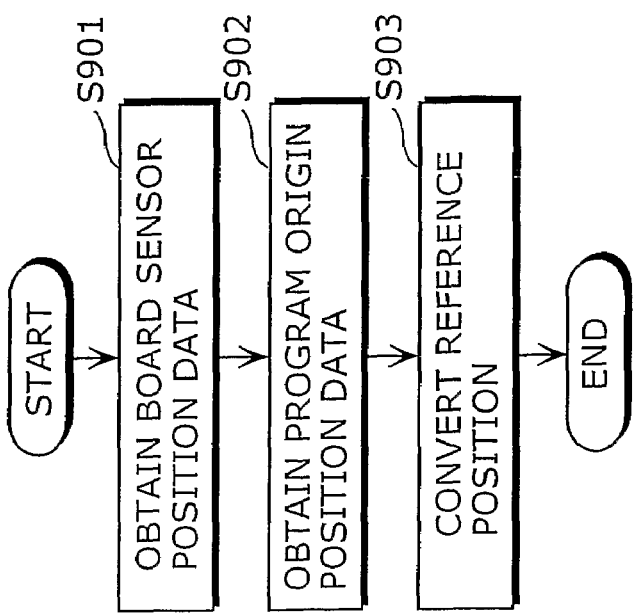

FIGS. 11A and 11B are flowcharts showing a process of converting a coordinate system with a program origin into a coordinate system with machine origin.

As shown in FIG. 11A, regarding the mounting stage 110 on the downstream side of the mounter 100, the position data of the second board sensor 136 (machine origin) is obtained (S901); the position data of the program origin is obtained (S902); an offset between the machine origin and the program origin is calculated based on the two position data; and then the coordinate data of the NC program is converted into a coordinate system using the machine origin as a reference position (S903). The mounting operation is performed based on the coordinates of the mounting points 260 of a coordinate system using the aforesaid converted machine origin as a reference position.

It should be noted that an absolute coordinate system defined coordinate positions of a machine origin and a program origin is defined in advance, and the aforesaid machine origin and program origin are obtained based on the absolute coordinate system.

Note that the offset to the program origin using the machine origin as reference position may be set up in advance.

Regarding the mounting stage 109 on the upstream side as shown in FIG. 11B, the position data of the first board sensor 135 (machine origin) is obtained (S904); the position data of the program origin is obtained (S905); the board length data is obtained based on the board size data set up in advance (S906); the length of the board is deducted from the position data of the first board sensor 135 (S907); an offset between the machine origin obtained from the result and the program origin is calculated; and the coordinate data of NC program is converted into a coordinate system data with machine origin (S908). Finally the mounting operation is performed based on the coordinates of the mounting points 260 in a coordinate system using the converted machine origin as a reference position.

Accordingly, at the time of NC data creation, the NC data can be created based on a coordinate system with an identical program origin as a reference position on the both mounting stages, so that the NC data can be created without considering the differences of the mounting stages.

Furthermore, with regard to the operation assignment for the respective mounting stages after the NC data is created, the mounting operation can be assigned considering the load condition, SO that the throughput of mounting can be improved.

Figure 12:
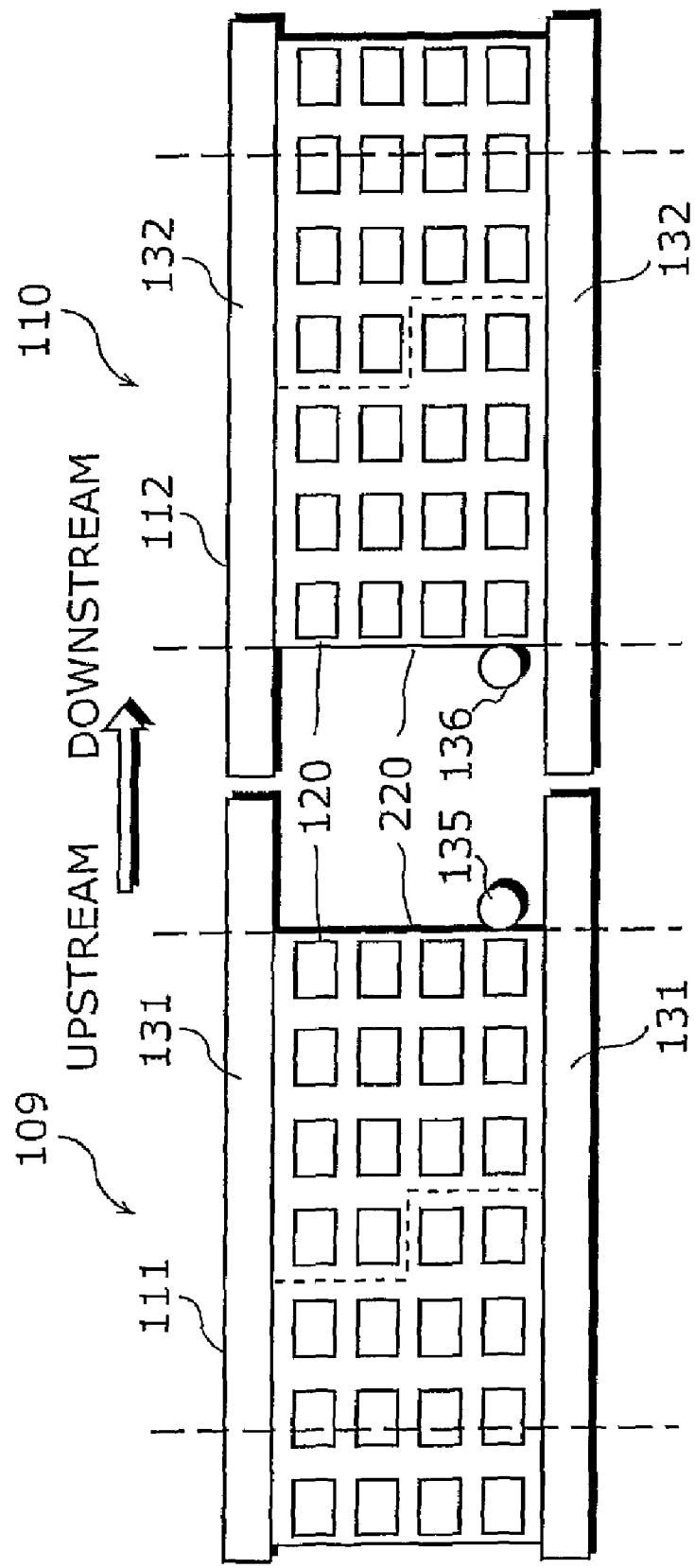
FIG. 12 is a plan view showing boards placed on a carrier board.

In particular, in the case where the identical boards 120 are placed on a carrier board 220 in a matrix state as shown in FIG. 12, and the mounting operation to mount the same kind of electronic components on the respective boards 120 is performed, the aforesaid embodiment is the most appropriate.

Figure 13:
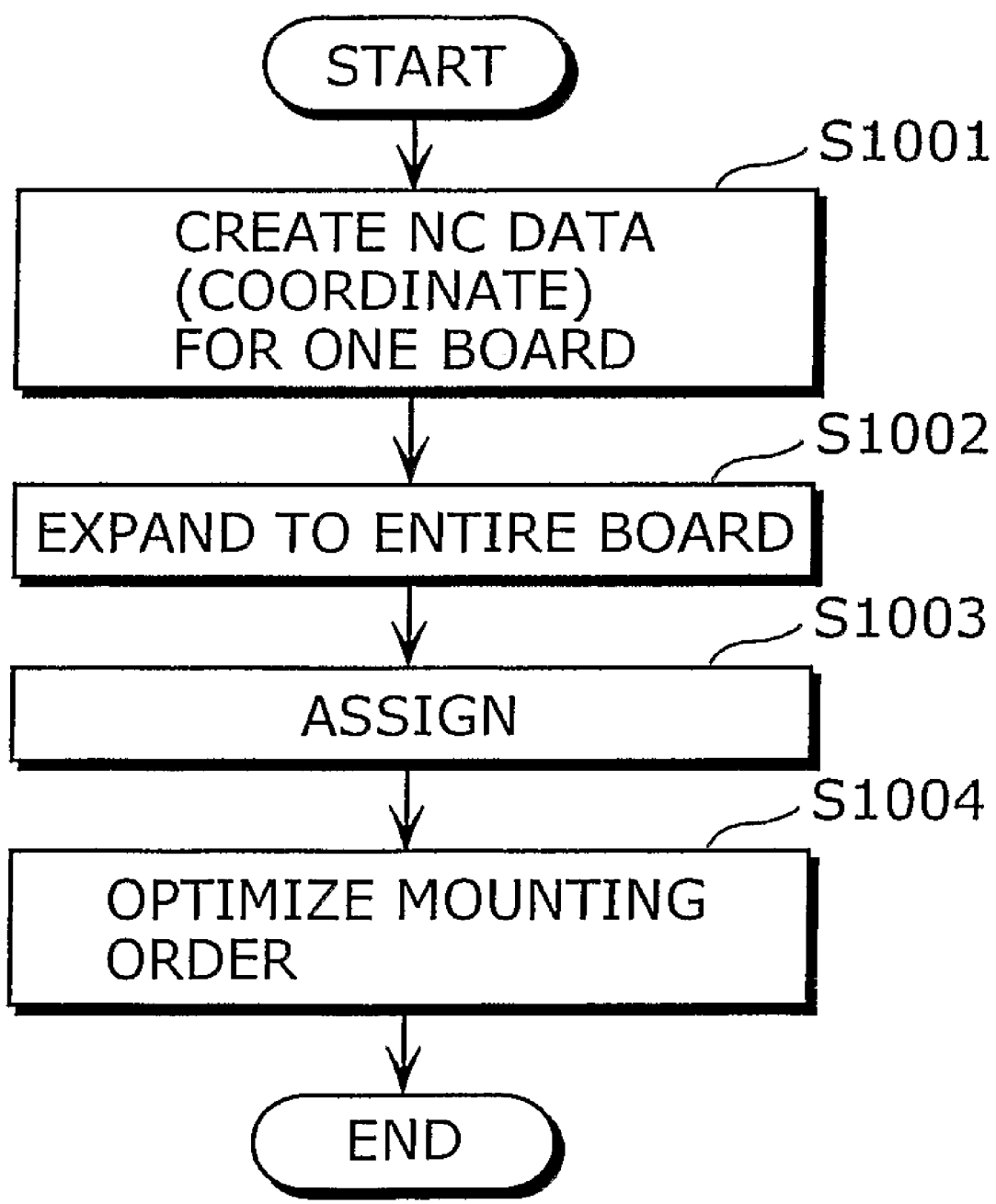
FIG. 13 is a flowchart showing an operation of NC data creation in the case where an electronic component is mounted onto the board placed on the carrier board.

In fact, in the case of a long carrier board 220, the number of the boards 120, which can be placed on the carrier board 220, is increased, so that the operation efficiency can be improved and the productivity can be enhanced. Furthermore, as shown in FIG. 13, an NC coordinate of a mounting point for one board 120 is created (S1001), so that the NC coordinate can be easily expanded based on the pitches between lines and between rows of the respective boards 120 arrayed in matrix state (S1002). In addition, it is not necessary to assign electronic components to be positioned evenly on the respective mounting stages like the conventional mounter, but the mounting positions for the electronic components can be assigned to the upstream side and the downstream side on board basis, so as to simply make the number of the boards identical or nearly identical (S1003). Furthermore, the mounting order can be the same for the respective boards, and it is not necessary to define the mounting order for the respective boards (S1004), so that it is possible to implement the mounting operation easily.

Figure 14:
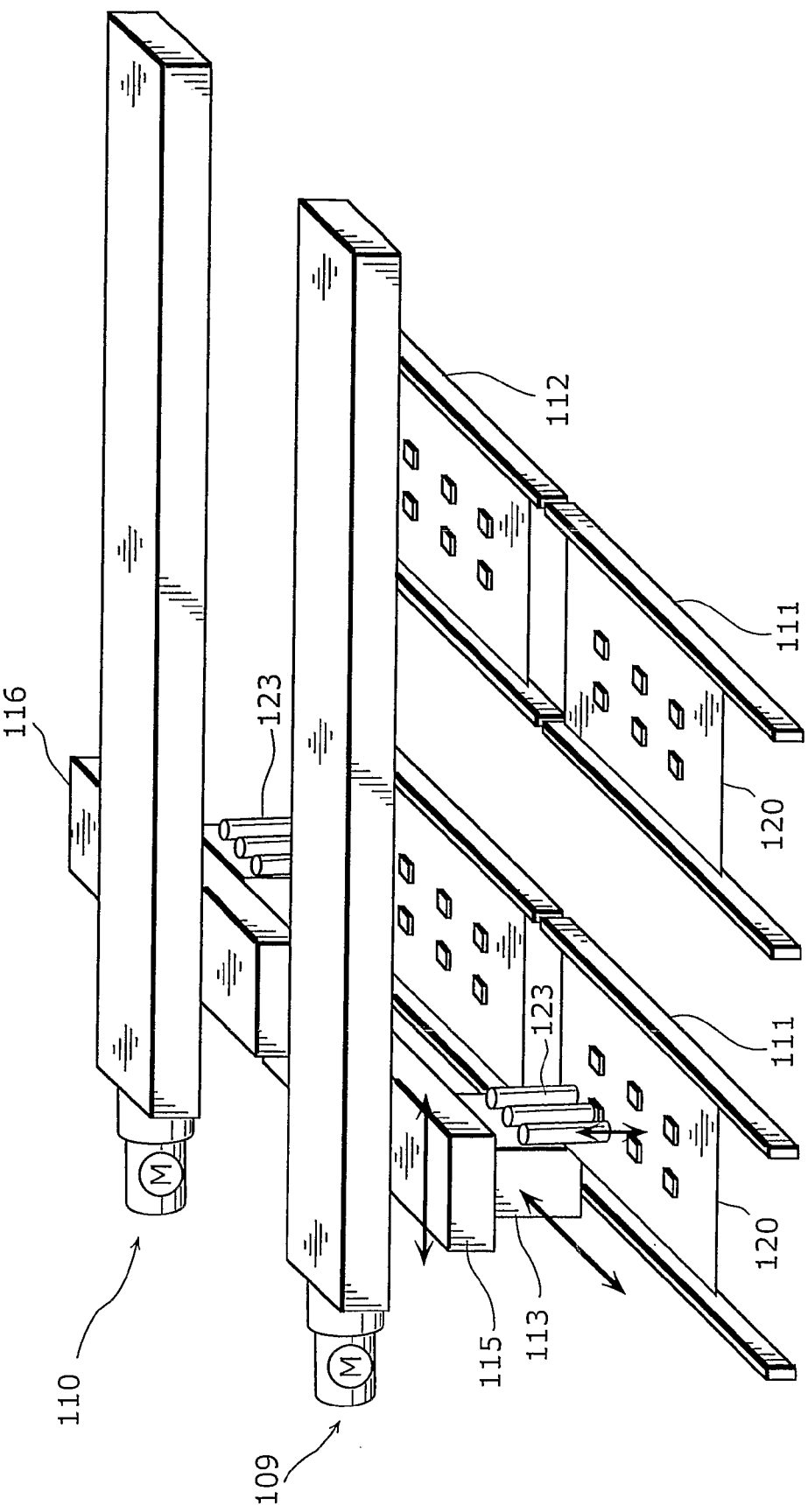
FIG. 14 is an external perspective view showing mounting stages with transportation units arrayed in two rows in parallel.

Furthermore, in the case where the transportation units 111 and 112 for transporting the boards 120 are arrayed in two rows as shown in FIG. 14, the electronic component can be mounted on a transportation line, while the board 120 is transported on another transportation line, so that the productivity can be enhanced. In fact, transportation lines can be added in the mounter, so that the mounter can be downsized, and the productivity per area can be enhanced.

Furthermore, the board sensor in the aforesaid embodiment is extended downward from above the board and the carry-in sensor/carry-out sensors are placed above the board. However the present invention is not limited to this configuration, and the sensors can be placed on an arbitrary position in an arbitrary direction as long as such capability can be achieved. For example, the board sensor can be placed below the board so as to extend upward. The carry-in sensor/carry-out sensor may be placed below the board, so as to detect the board in upper direction.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The present invention is applicable to a mounter including a plurality of mounting stages.

The invention claimed is:

1. A component mounting method for a mounter including at least two mounting stages in which components are mounted onto boards transported from the upstream side in a transportation direction of the boards and then the boards are transported to the downstream side, said method comprising:
   stopping a first edge of a first board on a first mounting stage;
   stopping a second edge of a second board on a second mounting stage such that the second edge of the second board faces the first edge of the first board, the second mounting stage being on a downstream side of the mounter relative to the first mounting stage;
   obtaining position data on a first origin, the first origin being a reference position for coordinates of mounting points;
   obtaining position data on a second origin, the second origin showing a position of a stopping unit of the first mounting stage;
   obtaining position data on a third origin, the third origin showing a position of a stopping unit of the second mounting stage;
   converting the coordinates of the mounting points into first converted coordinates using the second origin as a reference;
   mounting a component onto the first board stopped on the first mounting stage based on the first converted coordinates;
   converting the coordinates of the mounting points into second converted coordinates using the third origin as a reference; and
   mounting a component onto the second board stopped on the second mounting stage based on the second converted coordinates.

2. The component mounting method of claim 1, further comprising:
   obtaining data on a length of the first board;
   deducting the length of the first board from the position data on the second origin.

3. The component mounting method of claim 1, further comprising:
   obtaining data on a length of the second board;
   deducting the length of the second board from the position data on the third origin.

* * * * *

UNITED STATES PATENT AND TRADEMARK OFFICE
CERTIFICATE OF CORRECTION

PATENT NO.       : 7,591,068 B2                                           Page 1 of 1
APPLICATION NO.  : 11/663766
DATED            : September 22, 2009
INVENTOR(S)      : Masaru Kawazoe et al.

It is certified that error appears in the above-identified patent and that said Letters Patent is hereby corrected as shown below:

ON THE TITLE PAGE

On page 1, left column, in Section (62), PCT No., please change "PCT/JP2006/002897" to --PCT/JP2006/302897--.

Signed and Sealed this

Eleventh Day of May, 2010

David J. Kappos
*Director of the United States Patent and Trademark Office*

UNITED STATES PATENT AND TRADEMARK OFFICE
CERTIFICATE OF CORRECTION

PATENT NO. : 7,591,068 B2
APPLICATION NO. : 11/663766
DATED : September 22, 2009
INVENTOR(S) : Masaru Kawazoe et al.

It is certified that error appears in the above-identified patent and that said Letters Patent is hereby corrected as shown below:

ON THE TITLE PAGE

On page 1, left column, in Item (86), PCT No., please change "PCT/JP2006/002897" to --PCT/JP2006/302897--.

This certificate supersedes the Certificate of Correction issued May 11, 2010.

Signed and Sealed this

Twenty-second Day of June, 2010

David J. Kappos
*Director of the United States Patent and Trademark Office*